(12) United States Patent
Vintola

(10) Patent No.: US 6,965,837 B2
(45) Date of Patent: Nov. 15, 2005

(54) METHOD AND ARRANGEMENT FOR DETECTING LOAD MISMATCH, AND A RADIO DEVICE UTILIZING THE SAME

(75) Inventor: Ville Vintola, Espoo (FI)

(73) Assignee: Nokia Corporation, Espoo (FI)

( * ) Notice: Subject to any disclaimer, the term of this patent is extended or adjusted under 35 U.S.C. 154(b) by 115 days.

(21) Appl. No.: 10/683,261

(22) Filed: Oct. 10, 2003

(65) Prior Publication Data

US 2004/0075504 A1 Apr. 22, 2004

(30) Foreign Application Priority Data

Oct. 18, 2002 (FI) ................................. 20021861

(51) Int. Cl.$^7$ ............................................. G01R 27/00
(52) U.S. Cl. .................... 702/65; 455/115.1; 455/126; 455/129; 330/284; 330/144; 324/600
(58) Field of Search ........................... 702/65, 85, 107; 455/126, 115.1, 123, 129, 117; 330/298, 330/207 P, 145, 149, 284, 144; 324/646, 324/648, 600

(56) References Cited

U.S. PATENT DOCUMENTS

| | | | |
|---|---|---|---|
| 4,673,886 A | * | 6/1987 | Bickley et al. ............ 330/298 |
| 4,704,573 A | * | 11/1987 | Turner, Jr. .................. 324/646 |
| 4,727,337 A | * | 2/1988 | Jason ......................... 330/298 |
| 5,564,086 A | * | 10/1996 | Cygan et al. ............... 455/126 |
| 6,215,359 B1 | | 4/2001 | Peckham et al. |

* cited by examiner

Primary Examiner—John Barlow
Assistant Examiner—Hien Vo
(74) Attorney, Agent, or Firm—Alfred A. Fressola; Ware, Fressola, Van Der Sluys & Adolphson LLP

(57) ABSTRACT

A method and an arrangement for detecting impedance mismatch between an output of a radio frequency amplifier (200, 901, 911, 921, 1101) which has an amplifying component (201, 301, Q46, 701, 801) and an input of a load (203, 302) coupled to the output of the radio frequency amplifier having: first monitoring means (401) to monitor a measurable electric effect (311) at a side of the amplifying component (201, 301, Q46, 701, 801) other than the load (203, 302) and to produce a first measurement signal (411). Second monitoring means (402) monitor a measurable electric effect (312) between the amplifying component (201, 301, Q46, 701, 801) and the load (203, 302) and produce a second measurement signal (412). Decision-making means (204, 902, 912, 923, 1102) receive said first (411) and second (412) measurement signals and decide, whether said first and second measurement signals together indicate impedance mismatch.

24 Claims, 7 Drawing Sheets

METHOD AND ARRANGEMENT FOR DETECTING LOAD MISMATCH, AND A RADIO DEVICE UTILIZING THE SAME

CROSS REFERENCE TO RELATED APPLICATIONS

This application claims priority under 35 USC §119 to Finnish Patent Application No. 20021861 filed on Oct. 18, 2002.

TECHNICAL FIELD

The invention concerns generally the technology of radio frequency power amplifiers and their coupling to loads, particularly to transmission antennae. Especially the invention concerns the technology of detecting an impedance mismatch condition between a radio frequency power amplifier and an antenna coupled thereto.

BACKGROUND OF THE INVENTION

A power amplifier is essentially the last stage of a transmitter before a connection to a load, which in a radio transmitter means a transmitting antenna. Preceding stages of the transmitter produce a radio frequency signal by modulating a radio frequency carrier with a lower-frequency payload signal. The task of the power amplifier is to amplify the produced radio frequency signal enough so that directing it in amplified form to a transmitting antenna will cause the radio frequency signal to be transmitted in the form of electromagnetic radiation at a desired power level. The transmitting process should be accomplished as effectively as possible, i.e. with as little loss as possible, especially in portable radio devices where electric energy should be carefully saved in order to prolong the time before next required battery recharging.

One of the principal issues affecting transmission efficiency is impedance matching between the power amplifier and the antenna. Under steady-state conditions a transmitting antenna has a constant input impedance, so it should be rather straightforward to design the output of the power amplifier so that it matches the impedance of the antenna and impedance matching would thus be close to perfect. Problems arise because a practical antenna is not operating under steady-state conditions. Large and/or well-conducting bodies brought close to the antenna change the impedance characteristics of the antenna, which causes impedance mismatch between the antenna and the power amplifier, commonly referred to as antenna mismatch. The hand of a user is frequently close enough to the antenna of a portable telephone to cause problems of this kind. Additionally the impedance of any signal port is a function of frequency and power. Most modern portable radio devices employ transmission power control, which causes the amplification factor, and subsequently also the output impedance, of the power amplifier to change. This again tends to give rise to mismatch problems.

Increased transmission loss is not the only negative consequence of impedance mismatch between a power amplifier and an antenna. Mismatch causes the power amplifier to operate at a needlessly high power level, which tends to cause distortion in the radio frequency signal. The problem is worst with linear amplifiers, the use of which is mandatory with most amplitude-affecting modulation methods, because the amplification level of a linear amplifier cannot be cut back controllably as a response to a detected antenna mismatch as with nonlinear amplifiers. It should be noted, though, that linearity problems caused by antenna mismatch are most prominent at high transmission power levels, and consequently their severity in low-power handheld devices is quite modest.

In principle the same problems arise in every transmission application, regardless of whether the power amplifier is coupled to an antenna, to a transmission wireline or to any other load. Portable radio transmitter applications where the load is an antenna are, however, the most prone to mismatch effects because there it is the most difficult to predict or eliminate the incidentally occurring circumstances that alter the load impedance.

The conventional way of eliminating the effects of antenna mismatch is to use an isolator between the power amplifier and the antenna. The isolator approach is, however, ill suited for small-sized portable radio devices, because a conventional isolator is a large and clumsy component and it draws a prohibitively large electric power during times when it has to compensate a large mismatch. Certain small-sized isolator solutions have been introduced, but it is still unprobable that they could be e.g. integrated with a power amplifier. Additionally the characteristically high power dissipation during severe mismatch conditions remains as a drawback of even small-sized isolators, because the functional principle of an isolator comprises dissipating reflected power in a resistor.

Other known ways exist too for eliminating the effects of antenna mismatch. The patent publication U.S. Pat. No. 5,564,086 presents one functional principle, which is also illustrated in FIG. 1. According to this principle a directional coupler 101 between the power amplifier 102 and the antenna 103 is used to detect antenna mismatch. A processor 104 is coupled to receive the mismatch detection information from the directional coupler 101. Between the power amplifier 102 and the directional coupler 101 there is a controllable variable matching network 105. From an output of the processor 104 there is a connection to a control input of the variable matching network 105. The processor 104 is programmed to respond to mismatch detection information from the directional coupler 101 by changing the characteristics of the variable matching network 105 appropriately, thus reducing the effects of antenna mismatch.

The drawbacks of the arrangement of FIG. 1 are related to the discrete nature of a directional coupler. It is very difficult, if not impossible, to integrate a directional coupler to a common integrated circuit with anything, particularly with a power amplifier. Thus the use of a directional coupled tends to increase overall size and manufacturing cost. Additionally every additional component, even a directional coupler, along the high power signal line from the power amplifier to the antenna carries a risk of increasing losses.

SUMMARY OF THE INVENTION

It is an objective of the present invention to provide a method and an apparatus for antenna mismatch detection that would allow integration with other components. An additional objective of the invention is to provide a method and an apparatus for detecting antenna mismatch accurately and reliably under a variety of operational conditions. A further objective of the invention is to reduce losses caused by antenna mismatch detection in comparison with previous known solutions.

The objectives of the invention are achieved by monitoring the electric operation of a power amplifier, making deductions about antenna mismatch based on the monitoring results, and driving a mismatch compensating arrangement on the basis of such deductions.

An antenna mismatch detection arrangement according to the invention is characterised in that it comprises:

first monitoring means adapted to monitor a measurable electric effect at other side of an amplifying component than a load and to produce a first measurement signal, second monitoring means adapted to monitor a measurable electric effect between the amplifying component and the load and to produce a second measurement signal, and decision-making means adapted to receive said first and second measurement signals and to decide, whether said first and second measurement signals together indicate impedance mismatch.

The invention applies also to a method of detecting antenna mismatch. The method according to the invention is characterised in that it comprises the steps of:

monitoring a measurable electric effect at other side of an amplifying component within the radio frequency amplifier than the load, and producing a first measurement signal, monitoring a measurable electric effect between said amplifying component within the radio frequency amplifier and the load, and producing a second measurement signal, and deciding, whether said first and second measurement signals together indicate impedance mismatch.

Additionally the invention applies to a mobile communication device where antenna mismatch is detected according to the inventive principle. The mobile communication device according to the invention is characterised in that it comprises:

a transmitter block, within the transmitter block a radio frequency amplifier having an amplifying component and an output port, and an antenna coupled to the output port of the radio frequency amplifier;

wherein for detecting impedance mismatch between the antenna and the output port of the radio frequency amplifier the mobile telecommunication device comprises:

first monitoring means adapted to monitor a measurable electric effect at other side of the amplifying component than the antenna and to produce a first measurement signal, second monitoring means adapted to monitor a measurable electric effect between the amplifying component and the antenna and to produce a second measurement signal, and decision-making means adapted to receive said first and second measurement signals and to decide, whether said first and second measurement signals together indicate impedance mismatch.

Advantageous embodiments of the invention are described in the depending patent claims.

A power amplifier inherently includes an amplifying component, typically a transistor. The invention utilizes the fact that an amplifying component of this kind provides quite good isolation in the reverse direction. In other words, electric effects that appear on the output side of the amplifying component do not propagate in any practically significant amount across the amplifying component to its input side.

Antenna mismatch causes certain electric effects on the output side of a final stage in a power amplifier. According to the present invention a measurement and comparison circuit monitors such electric effects and compares them against a corresponding measurement on the input side of the final stage. Antenna mismatch causes the measurement results on each side of the final stage to differ from each other. Thus the measurement and comparison circuit is capable of producing an output signal the value of which indicates the current degree of antenna mismatch. This value can then be taken further to some controllable compensating means that act to compensate the antenna mismatch.

A readily available electric effect to be measured is the peak radio frequency voltage at an output port of an amplifying transistor. A power amplifier has typically at least two stages, which means that two amplifying transistors constitute a cascade connection where the output of one transistor drives the input of the other. A peak RF voltage at the output port of the second or final stage transistor is a function of the load value seen at the output port and thus also a function of output mismatch. The good isolation characteristics of the second stage transistor mean that a peak RF voltage measured between the transistors, i.e. at the output of the first stage which also is the input of the second stage, does not depend on the output load. A comparison of these measured peak RF voltages reveals a load (antenna) mismatch condition.

In a clear contrast to conventional isolators and directional couplers, a measurement and comparison circuit of the above-described kind is readily available for integration into a common integrated circuit with a power amplifier. Therefore the invention allows the size and manufacturing cost of a radio transceiver to be reduced. Additionally the measurement and comparison circuit dissipates only minimal amounts of power under any operating conditions, so—if also the compensating arrangement can be made with only reasonable losses—an arrangement according to the invention also helps to further reduce the power consumption of a radio device.

BRIEF DESCRIPTION OF DRAWINGS

The novel features which are considered as characteristic of the invention are set forth in particular in the appended claims. The invention itself, however, both as to its construction and its method of operation, together with additional objects and advantages thereof, will be best understood from the following description of specific embodiments when read in connection with the accompanying drawings.

DETAILED DESCRIPTION OF THE INVENTION

The exemplary embodiments of the invention presented in this patent application are not to be interpreted to pose limitations to the applicability of the appended claims. The verb "to comprise" is used in this patent application as an open limitation that does not exclude the existence of also unrecited features. The features recited in depending claims are mutually freely combinable unless otherwise explicitly stated.

Regarding an issue of terminology, in the technological field of radio transmitters and especially transmitters in portable radio devices it has become customary to use the terms "power amplifier" and "PA" to designate an entity that comprises both an amplifying part and an impedance matching network that matches the output impedance of the amplifying component to a predetermined value. This is a further development from the practice of the early 1990's, according to which a single, individually packaged large transistor could be a "PA"—in present-day terminology a single large transistor would rather appear as a power transistor. In order for a present-day PA to qualify as a "power" amplifier the amplifying component within it must be dimensioned for output powers that are suitable for coupling to a transmitting antenna, in contrast to ordinary amplifiers that only handle signals within local semiconductor circuitry. In this description of the invention and its preferable embodiments the term "amplifying component" refers to a circuit element (or a simple combination of circuit elements) that only implements an amplifying function, a "matching network" is a circuit element or a piece of circuitry for matching impedances, and a "power amplifier" comprises both of these.

Figure 1:
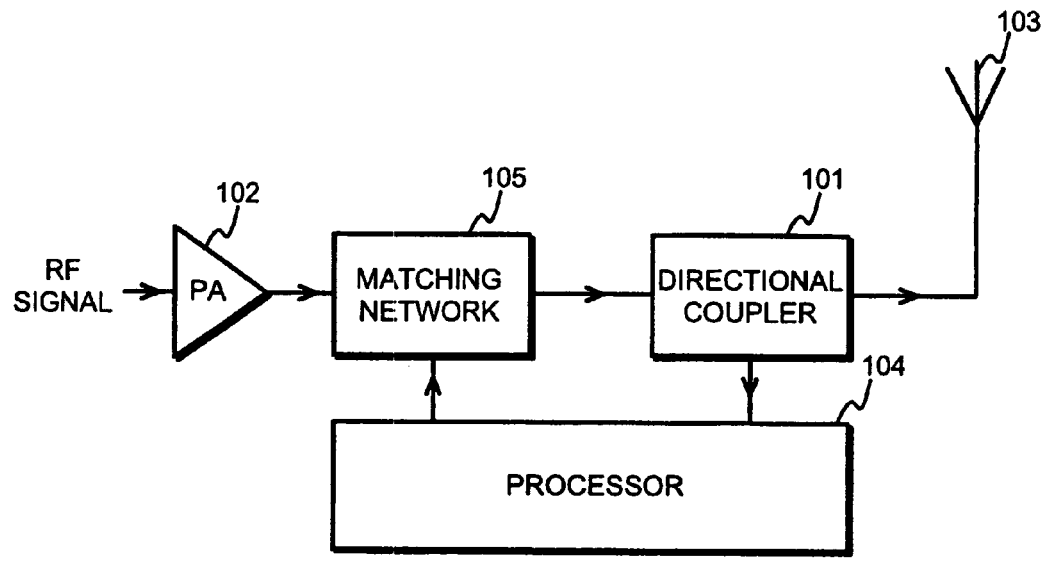
FIG. 1 illustrates a prior art arrangement for antenna mismatch detection and compensation.
Figure 2:
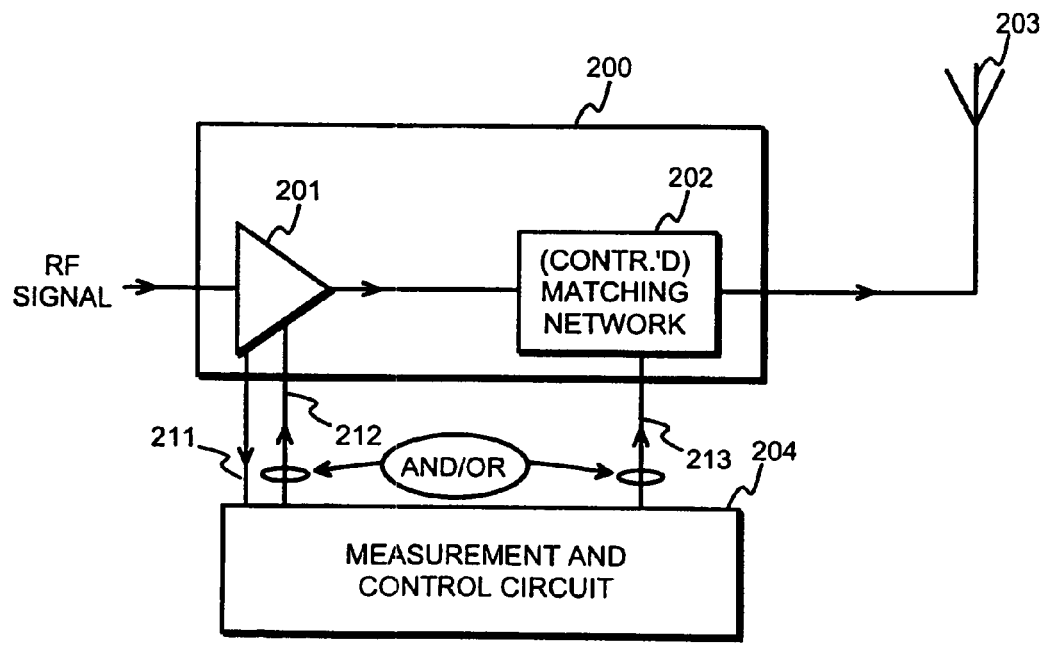
FIG. 2 illustrates schematically the principle of antenna mismatch detection and compensation according to the invention.

FIG. 2 illustrates schematically how antenna mismatch is detected and compensated for according to the present invention. A power amplifier 200 comprises the series connection of an amplifying component 201 and a matching network 202. An input of the amplifying component 201 is adapted to receive a radio frequency signal, and an output of the matching network 202 is adapted to convey an amplified radio frequency signal to an antenna 203. The task of the matching network 202 is to match the output impedance of the power amplifier 200 to the input impedance of the antenna 203.

The arrangement comprises a measurement and control circuit 204. A connection 211 between the amplifying component 201 and the measurement and control circuit 204 provides the latter with information about a certain measurable electric effect at the amplifying component 201. This measurable electric effect reflects the degree of mismatch between the power amplifier 200 and the antenna 203.

In order to compensate for a detected mismatch there is a control connection from the measurement and control circuit 204 to the power amplifier 200. Two mutually non-exclusive alternatives are shown in FIG. 2. One of them is a connection 212 from the measurement and control circuit 204 to the amplifying component 201; the use of such a connection requires that the amplifying component 201 has a control input through which it is possible to change what after the matching performed by the matching network 202 constitutes the overall output impedance of the power amplifier 200. The other possibility is a connection 213 from the measurement and control circuit 204 to the matching network 202; this possibility is available if the last-mentioned is a controllable matching network the matching characteristics of which can be changed by changing the value of an external control signal.

A third possibility would be to use a separate controllable impedance matching element truly between the power amplifier 200 and the antenna 203, i.e. between the output of the integrated matching network 202 and the input of the antenna 203. For the purposes of the present invention the approach that will be selected for compensating for a mismatch is not of primary importance. The invention is more focused on how a mismatch situation is detected, i.e. where does the connection 211 come from in the power amplifier 200 and what information it carries.

Figure 3:
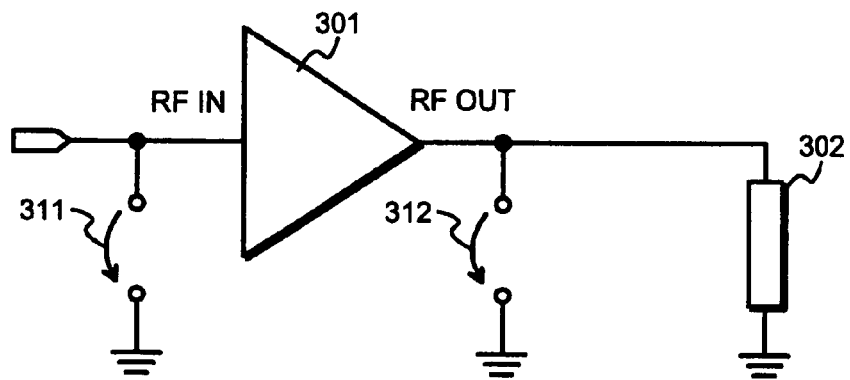
FIG. 3 illustrates the concept of detecting mismatch-based effects on different sides of an amplifying component.

FIG. 3 illustrates certain concepts that have importance to the invention. We may assume that an amplifying component 301 is coupled to amplify an RF signal and to direct it to a load 302. For the purposes of the following explanation we assume that the gain and output impedance of the amplifying component 301 are constants, while the input impedance of the load 302 may vary. When the input impedance of the load 302 is at a certain first value, the impedance matching between the output of the amplifying component 301 and the input of the load 302 is perfect (or as perfect as is possible with real-life circuits), and the VSWR (Voltage Standing Wave Ratio) at the interface between the amplifying component 301 and the load 302 has a certain minimum value, which is close to one. If the input impedance of the load 302 begins to drift from this optimum value, the impedance matching gets poorer and the VSWR begins to rise, up to a theoretical limiting case where all radio frequency power that the amplifying component 301 tries to deliver to the load is reflected back and the VSWR equals infinity.

The isolation properties of an amplifying component 301 against backwards signal propagation are typically very good. This means that the radio frequency power reflected back from the load 302 due to poor impedance matching has little or no effect on anything that could be detected at the input of the amplifying component 301. For example the peak RF voltage 311 observed at the input of the amplifying component 301 is only a function of input power to the amplifying component 301, and does not depend on how well the impedance matching at the output has succeeded. On the other hand, an increase in the VSWR has, among others, the directly observable effect of increasing the ratio of peak RF voltage 312 per output power at the output of the amplifying component 301. If our assumption about constant gain is taken, it is easy to show that the ratio of the input and output peak RF voltages 311 and 312 is constant except for the effects of the varying VSWR, which in turn results from variation in impedance matching. Thus it is possible to detect changes in impedance matching by monitoring the ratio of the input and output peak RF voltages 311 and 312.

Figure 4:
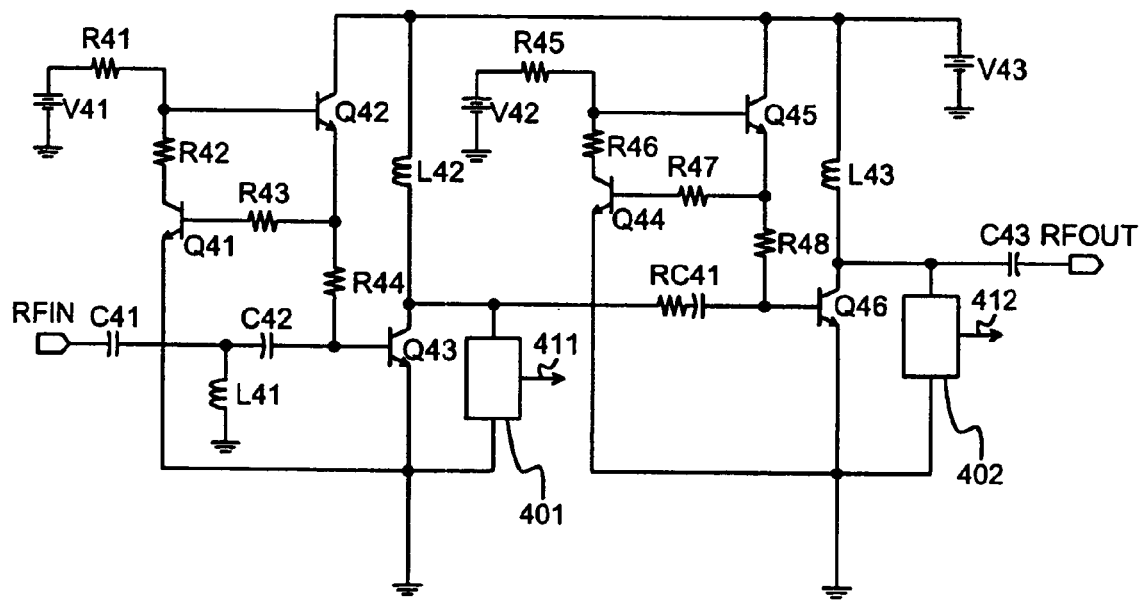
FIG. 4 illustrates an exemplary power amplifier in which load mismatch is detected according to the invention.

An amplifying component such as that 301 shown in FIG. 3, may be an amplifier by itself or it may constitute only a part (one stage) of a larger amplifier entity. FIG. 4 illustrates an exemplary RF amplifier that comprises two stages. The amplifier of FIG. 4 accepts an RF input signal at the terminal RFIN, from which there is a coupling through a DC separating capacitor C41 and an LC filter L41-C42 to the base of a first transistor Q43, which constitutes a first stage of the amplifier. From the collector of the first transistor Q43 there is a parallel L and series RC type connection L42-RC41 to the base of a second transistor Q46, which constitutes a second stage of the amplifier. From the collector of the second transistor Q46 there is a coupling through a DC separating capacitor C43 to an RF output terminal RFOUT. The operating voltages for the first and second stage amplifying transistors Q43 and Q46 come from a voltage source V43 through a first inductance L42 to the collector of the first transistor Q43 and through a second inductance L43 to the collector of the second transistor Q46. The emitters of the first and second stage amplifying transistors Q43 and Q46 are coupled to ground.

For biasing the first transistor Q43 there is a voltage source V41 from which a voltage is brought through a resistor R41 to a regulator connection R42-R43-Q41-Q42, which controls the bias voltage of the base of the first transistor Q43 through a resistor R44. A similar arrangement for biasing the second transistor Q46 consists of a voltage source V42, resistor R45, regulator connection R46-R47-Q44-Q45 and resistor R48.

In the arrangement of FIG. 4 the second amplifying transistor Q46 is the amplifying component the isolation characteristics of which are important to the invention. Changes in the impedance of a load connected to the output terminal RFOUT will cause detectable effects in the signal line from the collector of the second amplifying transistor Q46 to the output terminal RFOUT, but due to the isolation properties of the second amplifying transistor Q46 these changes should not change the load that the first amplifying transistor Q43 sees. According to the invention said effects at the output of the second amplifying transistor Q46 should be monitored and detected with the help of a comparison against unchanging reference measurements at the output of the first amplifying transistor Q43.

For the sake of generality we may state that according to the invention a first monitoring circuit 401 is connected to the output of the first amplifying transistor Q43, and a second monitoring circuit 402 is connected to the output of the second amplifying transistor Q46. The first monitoring circuit 401 is adapted to produce a first measurement signal 411, and the second monitoring circuit 402 is adapted to produce a second measurement signal 412. The measurement signals are indicative of effects that depend on load impedance. A comparison of the first and second measurement signals 411 and 412 reveals changes in the impedance of a load connected to the output terminal RFOUT, and thus also information about potential load impedance mismatch.

In a two-stage amplifier the first stage (transistor Q43 in FIG. 4) and the second stage (transistor Q46 in FIG. 4) are commonly referred to as the driver and the output stage. The fact that the comparison is made between the load electrode of the driver and the load electrode of the output stage, together with the facts that the two stages are located very close to each other in an integrated circuit and they share a common supply voltage and have identical biasing circuits, mean that many potential error sources such as temperature drift and supply voltage variation can be eliminated from the measurement: changes in load impedance and the effects direclty consequent thereupon are the dominant source of changes detected in a comparison between signals 411 and 412.

As such, it is of limited importance only to the invention from which point of the power amplifier one takes the reference with which to compare the characteristics detected at the output. The power amplifier may have more than two stages; indeed, in terminals of the GSM (Global System for Mobile telecommunications) and EDGE (Enhanced Datarates for GSM Evolution) systems it is commonplace to use three-stage power amplifiers, and using even more than three stages is not uncommon. As long as the reference is taken from the same amplifier chain, it does not matter how many amplifying stages there are between the reference point and the output.

Figure 5:
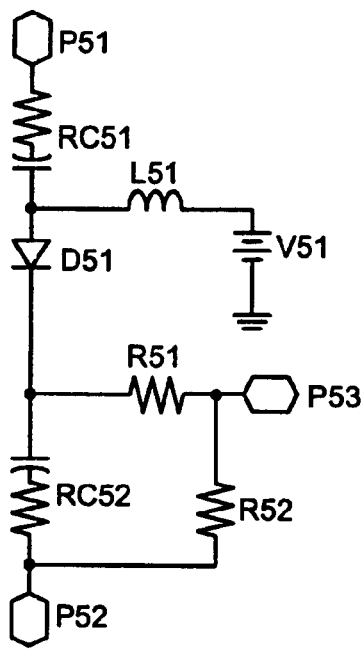
FIG. 5 illustrates an exemplary monitoring circuit for use according to the invention.

A quantity that is readily available for measurement at the output of an amplifying transistor and depends on load impedance matching in the way described above is peak RF voltage, which means that the first and second monitoring circuits 401 and 402 are typically peak RF voltage detectors and the first and second measurement signals 411 and 412 are indicative of detected peak RF voltage. FIG. 5 illustrates a simple exemplary peak RF voltage detector that can be used as a monitoring circuit. The circuit of FIG. 5 is a simple half-wave rectifier with a forward-biased diode D51 coupled to an input port P51 and a grounding port P52 through RC-type connections RC51 and RC52 respectively. For biasing the diode D51 there is an ideal bias circuit represented by a voltage source V51 coupled through an inductor L51 to the anode of the diode D51. A resistive voltage divider circuit R51-R52 is coupled between the cathode of the diode D51 and the grounding port P52, so that from the middle point between the resistors R51 and R52 there is a connection to an output port P53.

Using a peak RF voltage detector according to FIG. 5 as the first monitoring circuit 401 in FIG. 4 means that the input port P51 is coupled to the collector of the first amplifying transistor Q43, the grounding port P52 is coupled to the emitter of the first amplifying transistor Q43 and the first measurement signal 411 is obtained from the output port P53. Similarly using a peak RF voltage detector according to FIG. 5 as the second monitoring circuit 402 in FIG. 4 means that the input port P51 is coupled to the collector of the second amplifying transistor Q46, the grounding port P52 is coupled to the emitter of the second amplifying transistor Q46 and the second measurement signal 412 is obtained from the output port P53.

A peak voltage detector is not the only possible detector arrangement. Instead of a peak voltage detector like that of FIG. 5, a peak current detector could be used. Various structural and functional alternatives for building a peak current detector are well known to persons skilled in the art, as are also alternatives to the basic peak voltage detector coupling shown in FIG. 5.

Previously we have already explained how the problems of detecting antenna mismatch (or load mismatch in general) and compensating for a detected mismatch are separate from each other in the sense that regardless of which approach was taken to solve one of them, there are usually several possible approaches to solving the other. For the sake of completeness we will consider some exemplary approaches to compensating for a mismatch that has been detected according to the principle shown in FIG. 3. In designing a compensating circuit it is possible to aim at more or less steplessly achieving perfect impedance matching at all imaginable circumstances or to use switchable arrangements through the use of which the output impedance of a power amplifier is set to that one of a number of available values that is closest to perfect matching.

Figure 6:
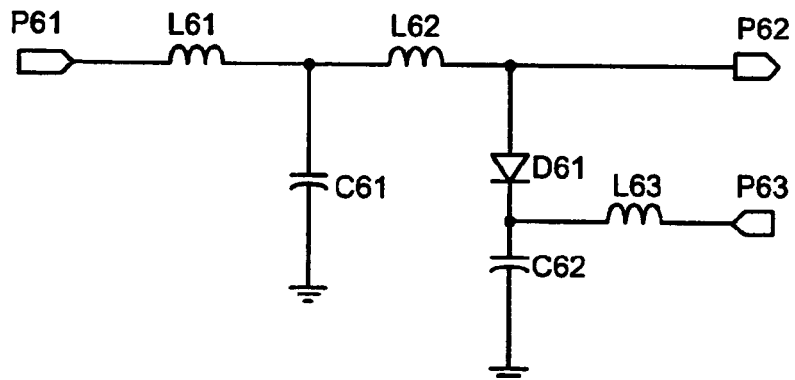
FIG. 6 illustrates an exemplary variable matching network.

FIG. 6 illustrates an example of a variable matching circuit. The output of a power amplifier is to be coupled to the first port P61, from which there is a series connection of two inductances L61 and L62 to the second port P62 that is meant to be coupled to a load, for example an antenna. From a point between the inductances L61 and L62 there is a connection to ground through a capacitance C61. From a point between the second inductance L62 and the second port P62 there is a controllable connection to ground through a diode D61 and a capacitance C62. A control connection from a control port P63 comes through an inductance L63 to the cathode of the diode D61. Either the first port P61 or the second port P62 is coupled to a positive supply voltage (not shown in FIG. 6).

The components that have an important role in impedance matching performed by the circuit of FIG. 6 are the inductances L61 and L62 as well as the capacitances C61 and C62. The effect of the capacitance C62 is controllable: a bias current supplied through the control port P63 and inductance L63 determines, whether the capacitance C62 is "visible" to the main signal line P61-L61-L62-P62 or not, and if it is, to what degree. It should be noted that depending on the operation of a biasing arrangement not shown in FIG. 6, the diode D61 can act either as an on/off switch or as a continuous range adjuster. A MEMS (MicroElectroMechanical System) switch could be used in place of a diode if on/off operation is desired. Also continuously adjustable MEMS components such as tunable MEMS capacitors exist. A tunable MEMS capacitor or other continuously adjustable MEMS component could be used to replace the diode D61 and the capacitance C62.

Figure 7:
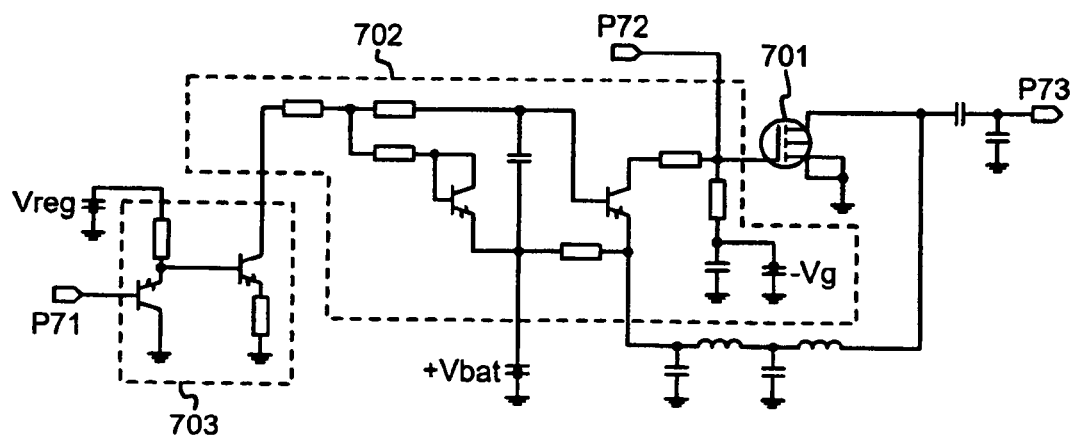
FIG. 7 illustrates an exemplary principle of using controllable bias.

A completely different approach to solving the problem of mismatch compensation is to utilize controllable biasing of the amplifying components in the power amplifier itself. Controllable biasing arrangements are known from prior art solutions, where they have been used for different purposes such as enhancing linearity. FIG. 7 illustrates an exemplary controllable biasing arrangement that is known from the patent publication U.S. Pat. No. 5,493,255. In this exemplary case only one amplifying component 701 is shown. It is adapted to receive an RF input signal through an input port P72 and to deliver an amplified RF output signal at an output port P73. A supply voltage for the amplifying component 701 is derived from the positive and negative supply voltages +Vbat and −Vg respectively. For generating and maintaining a bias voltage for the amplifying component 701 there is a biasing circuit 702, the operation of which is centrally influenced by a controllable current generator circuit 703. The original purpose of this arrangement was to control the biasing of an amplifying component in accordance with the momentarily required output power level; the value of a control voltage applied to a control port P71 in respect of a strictly regulated reference voltage Vreg controls the current that flows from the controllable current generator circuit 703 to the biasing circuit 702, which causes the bias voltage of the amplifying component 701 to vary in a controlled manner.

Figure 8:
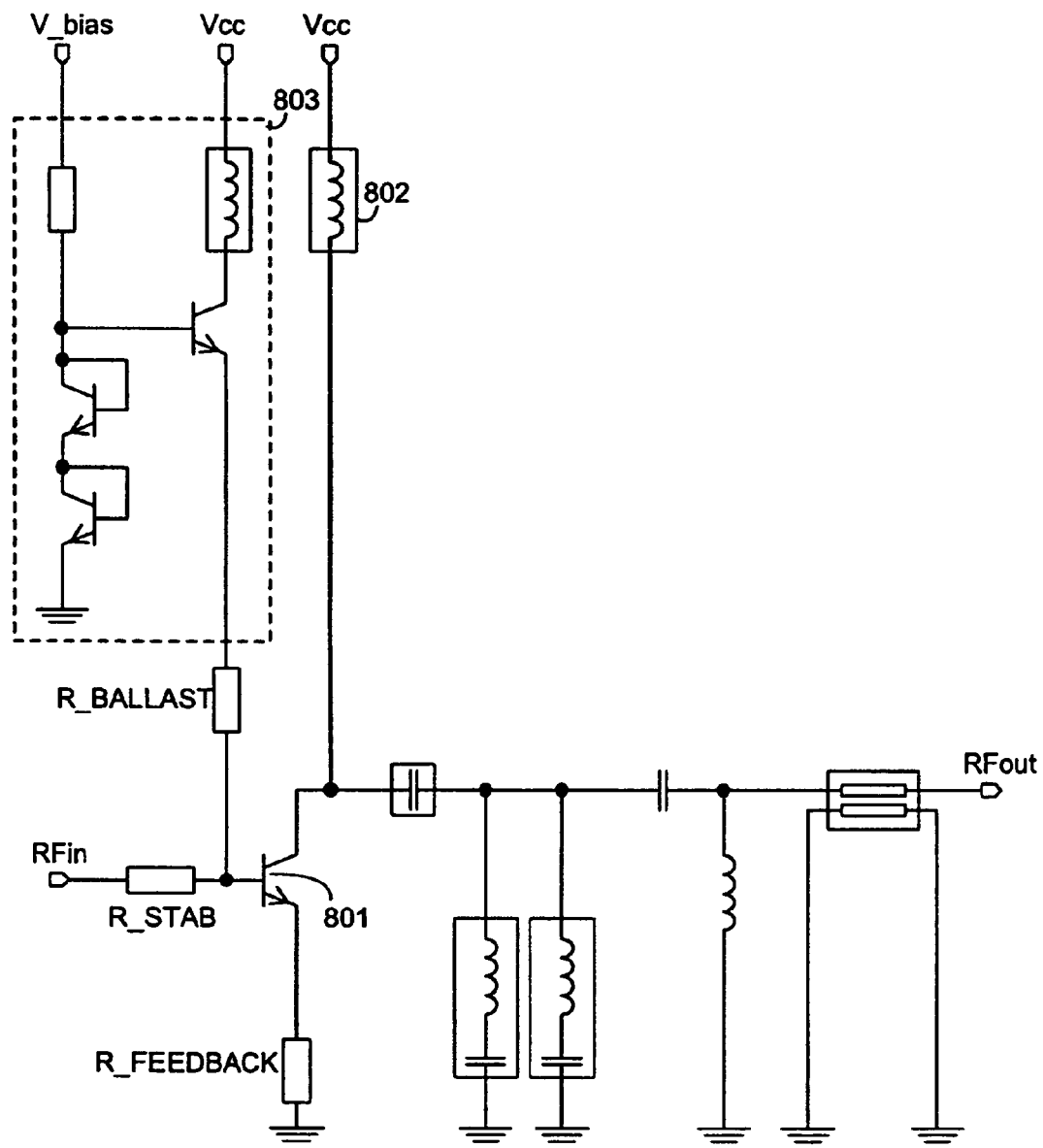
FIG. 8 illustrates another exemplary principle of using controllable bias.

FIG. 8 illustrates another previously known application of controllably biasing an amplifying component. This arrangement has been discussed in patent publication EP 0 883 241 A1 in the context of changing an output impedance of an power amplifier through biasing an amplifying component 801, e.g. an HBT (Heterojunction Bipolar Transistor). The amplifier's RF input RFin is connected to the transistor base via a stabilising resistor R_STAB. The operating voltage of the amplifier is brought to the collector of the transistor 801 from a positive voltage Vcc via an oscillation-suppressing inductance 802. A controllable biasing circuit 803 provides a bias to the base of the transistor 801 via a thermal ballast resistor R_BALLAST. The emitter of transistor 17 is connected to ground via a feedback resistor R_FEEDBACK.

Regarding the approach selected for compensating for detected load impedance mismatch it is even possible to combine different kinds of basic approaches: for example it is possible to use both a variable impedance matching network such as that of FIG. 6 and a controllable biasing arrangement such as those of FIGS. 7 and 8.

All components shown in FIGS. 4 to 8 and having the purpose of load impedance mismatch detection and compensation are easy to integrate, which means that the invention facilitates integrating not only the whole mismatch detection function but also a dynamically controlled mismatch compensation function into a single integrated circuit with the power amplifier itself. This is a remarkable advantage over prior art solutions, in which at least mismatch detection required discrete components.

Figure 9A:
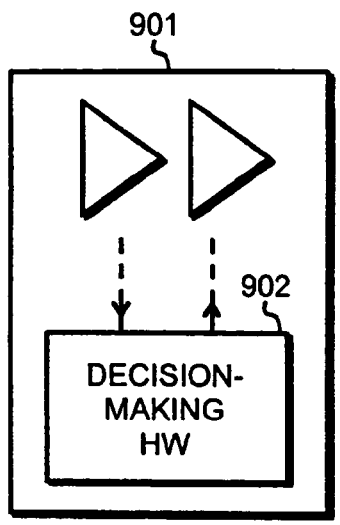
FIGS. 9a, 9b and 9c illustrate various alternative implementations for decision-making.
Figure 9B:
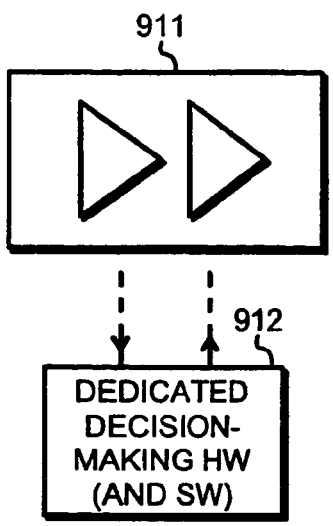
Figure 9C:
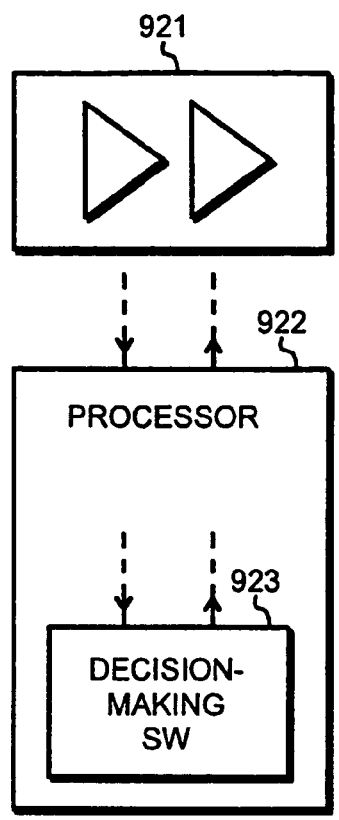

A decision-making arrangement is needed between those circuits that just monitor the effects of load impedance mismatch at the amplifier and those that implement a compensating function in a dynamically controlled manner. Three basic approaches are possible for its implementation, as is shown in FIGS. 9a, 9b and 9c. In the case of FIG. 9a an integrated power amplifier chip 901 includes integrated decision-making circuitry 902 that is adapted to accept as inputs the signals produced by the monitoring circuits, to produce a decision that reflects a logic according to which a detected mismatch must be compensated for, and to deliver to a dynamically controlled impedance matching arrangement an output signal that is in accordance with the decision and that is adapted to control such a dynamically controlled impedance matching arrangement into the direction of compensating for a detected impedance mismatch. It is well within the capability of a person skilled in the art to build appropriate decision-making hardware using e.g. comparators and operational amplifiers.

FIG. 9b illustrates a case where a power amplifier chip 911 does not include decision-making circuitry but there is a separate circuit arrangement 912 that comprises dedicated hardware and potentially also software for decision-making purposes. A dedicated decision and control block 912 may be functionally a piece of hardware circuitry like the arrangement 902 of FIG. 9a, or it may include programmable parts in which case also a control program is needed. Building a dedicated hardware and potentially software block 912 to fulfil the above-described decision and control purposes is within the capabilities of a person skilled in the art.

FIG. 9c illustrates a third possibility in which the decision and control function for impedance mismatch detection and compensation is implemented completely in software. A connection from a power amplifier 921 conveys the signals produced by monitoring circuits into an input of a processor 922, which is adapted to execute a piece of decision-making software 923 and to generate a control signal according to the outcome of a software decision. The control signal is coupled from an output of the processor 922 to a dynamically controlled impedance matching arrangement.

Figure 10:
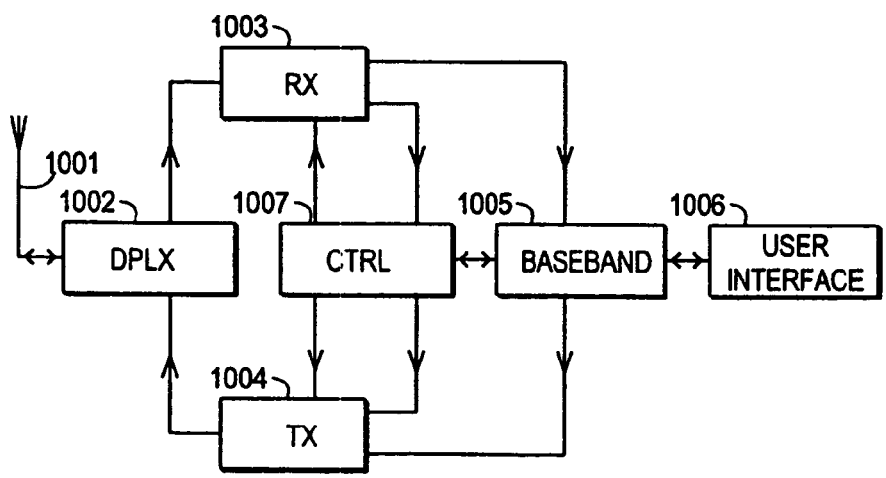
FIG. 10 illustrates schematically a portable radio device in which the invention can be used.

FIG. 10 illustrates schematically certain parts of a portable radio device according to an embodiment of the invention. An antenna 1001 is coupled through a duplexing block 1002 to a receiver block 1003 and a transmitter block 1004. The sink of payload data from the receiver block 1003 and the source of payload data to the transmitter block 1004 is a baseband block 1005 which in turn is coupled to a user interface block 1006 for communicating with a human or electronic user. A control block 1007 receives control information from the receiver block 1003 and transmits control information through the transmitter block 1004. Additionally the control block 1007 controls the operation of the blocks 1003, 1004 and 1005. In many portable radio devices the arrangement of a duplexing block 1002 and a single antenna 1001 has been replaced with two separate antennas, one for transmission and one for reception. The present invention is applicable regardless of the antenna solution, because even with a duplexing block the effects of changing antenna load tend to propagate through the duplexer to the output port of the transmitter block 1004.

Those embodiments of the invention where complete integration is aimed at (FIG. 9a) or where the decision-making functions are accomplished in dedicated hardware external to the power amplifier (FIG. 9b), involve implementing the whole invention within the transmitter block 1004. If the approach of FIG. 9c is chosen, the processor 922 may well be a part of the control block 1007.

We will conclude by considering the possible use of load mismatch detection for the purposes of transmitter output power detection in a portable radio device. In some known radio devices output power is detected by taking a sample of the forward power before an isolator between the power amplifier and the antenna, ie. still within a safe 50 ohm environment. The power that goes into the isolator is either radiated through the antenna to the air or reflected back and absorbed in a resistor of the isolator. The ratio of radiated and absorbed power depends on the current reflection coefficient, which in turn is a function of antenna input impedance. So in such a phone it is not possible to actually know, how much power is going out of the antenna; the sampling indicates only how much power the power amplifier is generating. The main use of such power detection inside the phone is preventing power amplifier saturation and only approximately knowing how much power is transmitted.

In such a scheme the load mismatch detector described earlier is available for use as a conventional power detector, if it embodies peak RF voltage detectors, because the relation between voltage and power is constant in a safe 50 ohm (or other constant impedance value) environment. However, the isolator makes it impossible to relate such detected RF power unambiguously with the RF power actually radiated into the air. In a radio device that does not include an isolator the degree of mismatch detected at the power amplifier output carries important information about the difference between the original output power of a power amplifier and the amount of power that was finally radiated into the air.

Figure 11:
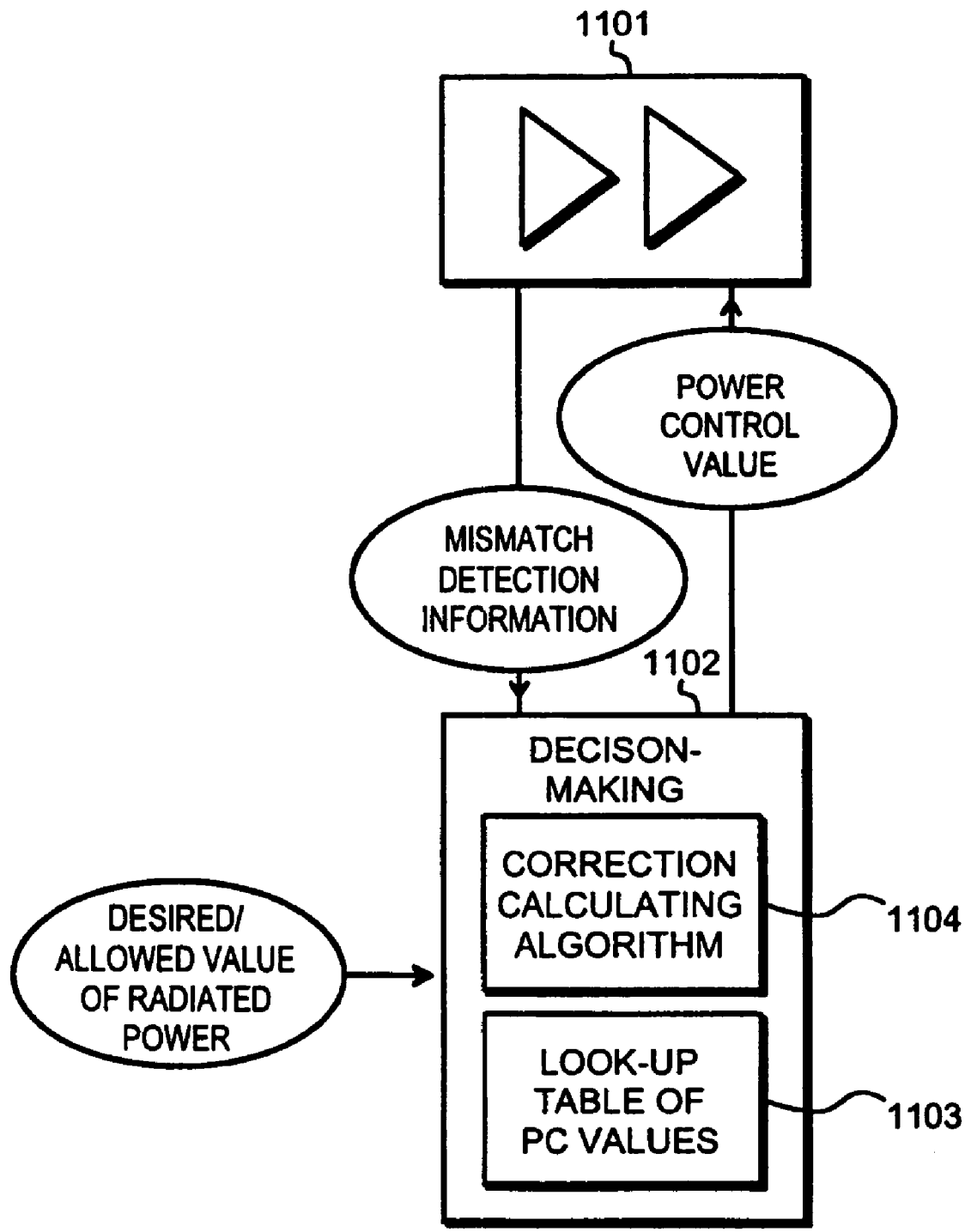
FIG. 11 illustrates the application of detecting mismatch to power control.

FIG. 11 illustrates an arrangement where the principle of load mismatch detection according to the invention is not used for compensating for the mismatch itself, but for compensating for the loss of radiated power that was a consequence of antenna mismatch. A power amplifier 1101 is adapted to deliver an amplified transmission signal into an antenna (not shown). Included in the power amplifier 1101 there is a load mismatch detection arrangement according to the present invention, which is adapted to produce mismatch detection information and to deliver it to a decision-making arrangement 1102. The location or practical implementation of the decision-making arrangement 1102 is not important.

In addition to the mismatch detection information the decision-making arrangement 1102 is adapted to receive information about an allowed and/or desired value of radiated power. In many cellular radio systems the maximum level of allowed transmission power is a cell-dependent parameter, which a mobile terminal receives as general broadcast information from the base station or radio network controller of the cellular radio system. At the disposal of the decision-making arrangement 1102 there is a look-up table 1103 for converting a received piece of information about an allowed and/or desired value of radiated power into a power control value for delivery to the power amplifier 1101. The values in the look-up table 1103 have been prepared with the assumption that impedance matching at the interface between the power amplifier 1101 and the antenna is normal.

To reap the benefits of the present invention the decision-making arrangement 1102 includes also a correction calculating algorithm 1104 for adapting a power control value read from the look-up table to the current impedance mismatch conditions. For example, if mismatch detection information reveals a mismatch to a degree that means that reflection loss at the antenna port is X decibels, where X is a real number, the correction calculating algorithm 1104 is adapted to correct the power control value read from the look-up table with an amount meaning an increase of X decibels in output power from the power amplifier.

The invention can also be applied simultaneously to power control as in FIG. 11 and to actual mismatch compensation according to the principle of FIG. 2. Such a combined approach is advantageous for example in a situation where a dynamically controlled impedance matching arrangement can only select the output impedance of the power amplifier to be one of a very limited set of values, so that very seldom it can completely cancel the actual load impedance mismatch. The transmission-power-reducing effect of the residual mismatch could then be compensated for by increasing the power amplifier output power according to the principle of FIG. 11.

Figure 12:
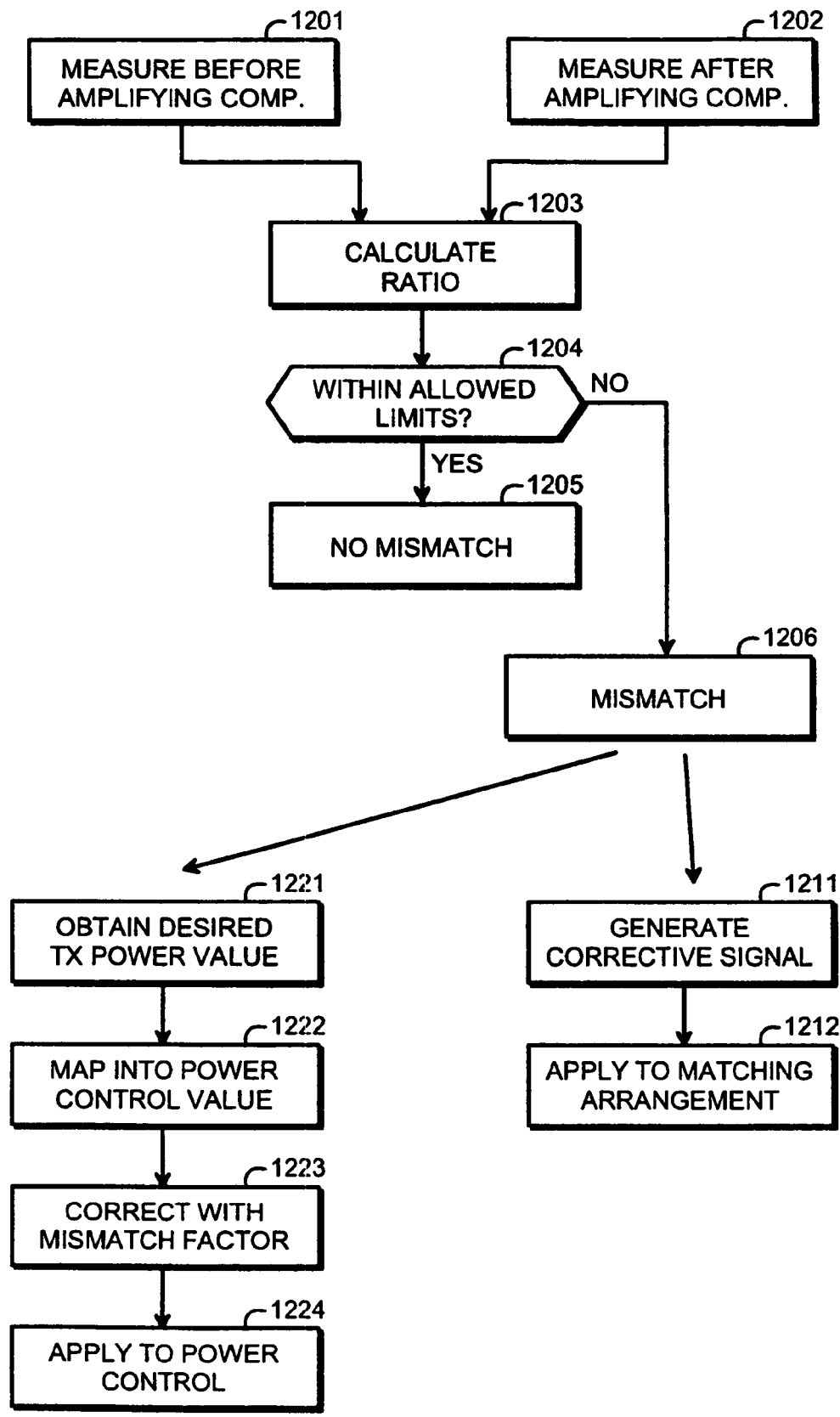
FIG. 12 illustrates certain method aspects of the invention.

FIG. 12 illustrates certain method aspects of the invention. Steps 1201 and 1202 represent monitoring a measurable electric effect before and after an amplifying component respectively, where the terms "before" and "after" refer to location in respect of the transmission direction of a radio frequency signal to be transmitted. Step 1203 represents processing a certain pair of obtained measurement signals in order to determine, whether they indicate mismatch. If peak RF voltage values are considered, step 1203 means calculating their ratio, which should be constant if there is no load impedance mismatch. At step 1204 there is made a decision, whether the value (e.g. a peak RF voltage value ratio) obtained at step 1203 is within the limits of not indicating mismatch. A positive finding leads to step 1205, which means that there is no mismatch and further action need not be taken. A negative finding at step 1204 means that there is a mismatch according to step 1206.

The lower part of FIG. 12 illustrates two ways of reacting to a detected mismatch. These are not exclusive alternatives, but either one or both can be adopted. Step 1211 means that there is determined and generated an appropriate corrective signal, which is then applied to a dynamically controllable impedance matching arrangement at step 1212. The last-mentioned may take the form of any of the alternative approaches discussed above, i.e. controlling a controllable impedance matching network and/or utilising controllable biasing to achieve the desired matching result. In the other possible course of action step 1221 corresponds to obtaining the value of desired transmission power, meaning the power that should be transmitted into the air or into a cable. The obtained value is mapped into a power control value at step 1222, and that value is corrected with a mismatch-dependent correction factor at step 1223. The mutual order of steps 1222 and 1223 can be switched, if the corrective factors are expressed in terms of desired power levels rather than in terms of corrections to power control values. The corrected power control value is applied to control the output power of a power amplifier at step 1224.

What is claimed is:

1. An arrangement for detecting impedance mismatch between an output of a radio frequency amplifier and an input of a load coupled to the output of the radio frequency amplifier, of which the radio frequency amplifier comprises an amplifying component, the arrangement comprising:

first monitoring means adapted to monitor a measurable electric effect at a side of the amplifying component other than the load and to produce a first measurement signal, second monitoring means adapted to monitor a measurable electric effect between the amplifying component and the load and to produce a second measurement signal, and decision-making means adapted to receive said first and second measurement signals, to compare said first measurement signal to said second measurement signal and to decide on the basis of such comparing, whether said first and second measurement signals together indicate impedance mismatch.

2. An arrangement according to claim 1, wherein said first monitoring means and said second monitoring means are peak radio frequency voltage detectors adapted to monitor peak radio frequency voltage and to produce signals indicative of detected peak radio frequency voltage.

3. An arrangement according to claim 2, wherein said decision-making means are adapted to compare a ratio of said first and second measurement signals with a constant, and to respond to a ratio of said first and second measurement signals differing from said constant by deciding that said first and second measurement signals together indicate impedance mismatch.

4. An arrangement according to claim 2, wherein said first monitoring means and said second monitoring means are half-wave rectifiers.

5. An arrangement according to claim 1, wherein said first monitoring means and said second monitoring means are peak radio frequency current detectors adapted to monitor peak radio frequency current and to produce signals indicative of detected peak radio frequency current.

6. An arrangement for detecting impedance mismatch between an output of a radio frequency amplifier and an input of a load coupled to the output of the radio frequency amplifier, of which the radio frequency amplifier comprises an amplifying component, the arrangement comprising:

first monitoring means adapted to monitor a measurable electric effect at other a side of the amplifying component other than the load and to produce a first measurement signal, second monitoring means adapted to monitor a measurable electric effect between the amplifying component and the load and to produce a second measurement signal, and decision-making means adapted to receive said first and second measurement signals and to decide, whether said first and second measurement signals together indicate impedance mismatch, wherein:

the radio frequency amplifier comprises amplifying components that constitute a chain of amplifying stages, of which one is an output stage, and which chain of amplifying stages is coupled between an input and an output of the radio frequency amplifier, said first monitoring means is adapted to monitor a measurable electric effect between said input of the radio frequency amplifier and said output stage, and said second monitoring means is adapted to monitor a measurable electric effect between said output stage and said output of the radio frequency amplifier.

7. An arrangement according to claim 6, wherein:

the radio frequency amplifier comprises two amplifying components, of which one is a driver stage and the other is an output stage, said first monitoring means is adapted to monitor a measurable electric effect between said driver stage and said output stage, and said second monitoring means is adapted to monitor a measurable electric effect between said output stage and an output of the radio frequency amplifier.

8. An arrangement according to claim 7, wherein:

the arrangement comprises dynamically controllable impedance matching means between said output stage and said output of the radio frequency amplifier, and said decision-making means is adapted to control said dynamically controllable impedance matching means, a consequence of such controlling being an effect of reducing impedance mismatch by said dynamically controllable impedance matching means.

9. An arrangement according to claim 8, wherein said dynamically controllable impedance matching means comprise:

a signal path for a signal to be transmitted from the radio frequency amplifier to the load, a capacitance coupled between said signal path and a ground potential, and a controllable switch adapted to selectively make connection from said signal path through said capacitance to ground potential;

and wherein said decision-making means is adapted to control said controllable switch.

10. An arrangement according to claim 7, wherein:

the arrangement comprises a dynamically controllable biasing arrangement adapted to control biasing of said output stage, and said decision-making means is adapted to control said dynamically controllable biasing arrangement, a consequence of such controlling being an effect of reducing impedance mismatch by changing the biasing of said output stage.

11. An arrangement according to claim 1, wherein:

the arrangement comprises transmission power control means for controlling how much radio frequency power is output from the radio frequency amplifier, said decision-making means is adapted to inform said transmission power control means when the decision-making means decide that said first and second measurement signals together indicate impedance mismatch, and said transmission power control means is adapted to respond to such informing by changing the control of how much radio frequency power is output from the radio frequency amplifier.

12. A mobile telecommunication device, comprising:

a transmitter block, within the transmitter block a radio frequency amplifier having an amplifying component and an output port, and an antenna coupled to the output port of the radio frequency amplifier;

wherein for detecting impedance mismatch between the antenna and the output port of the radio frequency amplifier the mobile telecommunication device comprises:

first monitoring means adapted to monitor a measurable electric effect at a side of the amplifying component other than the antenna and to produce a first measurement signal, second monitoring means adapted to monitor a measurable electric effect between the amplifying component and the antenna and to produce a second measurement signal, and decision-making means adapted to receive said first and second measurement signals, to compare said first measurement signal to said second measurement signal and to decide on the basis of such comparing, whether said first and second measurement signals together indicate impedance mismatch.

13. A mobile telecommunication device according to claim 12, wherein said decision-making means are located within the transmitter block.

14. A mobile telecommunication device according to claim 13, wherein the transmitter block comprises an integrated power amplifier circuit, which includes said first monitoring means, said second monitoring means and said decision-making means.

15. A mobile telecommunication device according to claim 13, wherein the transmitter block comprises a power amplifier circuit, which includes said first monitoring means and said second monitoring means, and the transmitter block further comprises said decision-making means in a circuit that is separate from the power amplifier circuit.

16. A mobile telecommunication device according to claim 12, wherein in addition to the transmitter block the mobile telecommunication device comprises a separate control block, so that said first monitoring means and said second monitoring means are located in the transmitter block and said decision-making means are located in said control block.

17. A mobile telecommunication device according to claim 12, wherein:

the mobile telecommunication device comprises transmission power control means for controlling how much radio frequency power is output from the transmitter block to the antenna, said decision-making means is adapted to inform said transmission power control means when the decision-making means decides that said first and second measurement signals together indicate impedance mismatch, and said transmission power control means is adapted to respond to such informing by changing the control of how much radio frequency power is output from the transmitter block.

18. A mobile telecommunication device according to claim 17, wherein said transmission power control means is adapted to receive a power control command from a cellular radio system and to choose a way of effecting such a power control command depending on whether the decision-making means has decided that said first and second measurement signals together indicate impedance mismatch.

19. A method for detecting impedance mismatch between an output of a radio frequency amplifier and an input of a load coupled to the output of the radio frequency amplifier, comprising:

monitoring a measurable electric effect at a side of an amplifying component within the radio frequency amplifier other than the load, and producing a first measurement signal, monitoring a measurable electric effect between said amplifying component within the radio frequency amplifier and the load, and producing a second measurement signal, comparing said first measurement signal to said second measurement signal and deciding on the basis of such comparing, whether said first and second measurement signals together indicate impedance mismatch.

20. A method according to claim 19, wherein:

the steps of monitoring a measurable electric effect involve monitoring a peak radio frequency voltage, and the step of deciding, whether said first and second measurement signals together indicate impedance mismatch, comprises the substeps of:

calculating a ratio of said first and second measurement signals, comparing said ratio with a constant, and in a case where said comparing shows that said ratio differs from said constant by an amount that is larger than a certain threshold, deciding that said first and second measurement signals together indicate impedance mismatch.

21. A method according to claim 19, wherein:

the steps of monitoring a measurable electric effect involve monitoring a peak radio frequency current.

22. A method according to claim 19, wherein for compensating for a detected impedance mismatch the method additionally comprises the steps of:

generating a corrective signal as a response to deciding that said first and second measurement signals together indicate impedance mismatch, and applying said corrective signal to a dynamically controllable impedance matching network between said amplifying component and the load in order to change its impedance matching characteristics.

23. A method according to claim 19, wherein for compensating for a detected impedance mismatch the method additionally comprises the steps of:

generating a corrective signal as a response to deciding that said first and second measurement signals together indicate impedance mismatch, and applying said corrective signal to a controllable biasing arrangement in order to change biasing of said amplifying component.

24. A method according to claim 19, wherein for compensating for a power loss due to a detected impedance mismatch the method additionally comprises the steps of:

correcting a power control value by a certain correction factor, the magnitude of which depends on how severe an impedance mismatch was detected, and applying the corrected power control value to the radio frequency amplifier in order to define its output power level.

* * * * *